(12) United States Patent
Kaneko et al.

(10) Patent No.: US 8,022,431 B2
(45) Date of Patent: Sep. 20, 2011

(54) ILLUMINATING APPARATUS, METHOD FOR FABRICATING THE USING THE SAME AND DISPLAY APPARATUS USING THE SAME

(75) Inventors: Hiroki Kaneko, Hitachi (JP); Ikuo Hiyama, Hitachinaka (JP); Toshiaki Tanaka, Kodaira (JP); Masaya Adachi, Hitachi (JP); Tsunenori Yamamoto, Hitachi (JP); Haruo Akahoshi, Hitachi (JP)

(73) Assignee: Hitachi Displays, Ltd., Chiba (JP)

( * ) Notice: Subject to any disclaimer, the term of this patent is extended or adjusted under 35 U.S.C. 154(b) by 1721 days.

(21) Appl. No.: 11/265,258

(22) Filed: Nov. 3, 2005

(65) Prior Publication Data

US 2006/0091406 A1    May 4, 2006

(30) Foreign Application Priority Data

Nov. 4, 2004    (JP) .................................. 2004-320409

(51) Int. Cl.
 *H01L 33/00*    (2010.01)
(52) U.S. Cl. ......................................... 257/99; 257/100
(58) Field of Classification Search .................... 257/99, 257/100, 666, 667; 372/43.01; 362/800; 313/500

See application file for complete search history.

(56) References Cited

U.S. PATENT DOCUMENTS 7,170,099 B2 *    1/2007    Noguchi ......................... 257/82
7,242,032 B2 *    7/2007    Oshio ............................. 257/99
2002/0145205 A1    10/2002    Hirano et al.

FOREIGN PATENT DOCUMENTS

| JP | 61-100982 | 5/1986 |
|---|---|---|
| JP | 7-235624 | 9/1995 |
| JP | 8-339707 | 12/1996 |
| JP | 10-247748 | 9/1998 |
| JP | 2000-286457 | 10/2000 |
| JP | 2003-17753 | 1/2003 |

OTHER PUBLICATIONS

SID03 Digest, High Brightness Direct LED Backlight for LCD-TV pp. 1262-1265, 2003.
SID04 Digest, High-Efficiency LEDs for LCD Backlights pp. 1222-1225, 2004.

* cited by examiner

*Primary Examiner* — Howard Weiss
*Assistant Examiner* — Steven H Rao
(74) *Attorney, Agent, or Firm* — Antonelli, Terry, Stout & Kraus, LLP.

(57) ABSTRACT

An illuminating apparatus has a reduced number of mounting spots by soldering or the like to permit an increased yield rate and a reduced cost. The illuminating apparatus has light emitting diodes, lead frames, and a transparent sealer. N light emitting diodes, N sets of lead frames mounted with the N light emitting diodes, and one set or more of lead frames each not mounted with a light emitting diode are sealed by the transparent sealer for integration into a modular illuminating apparatus. Also provided are a method for fabricating the illuminating apparatus, and a display apparatus using the illuminating apparatus.

18 Claims, 13 Drawing Sheets

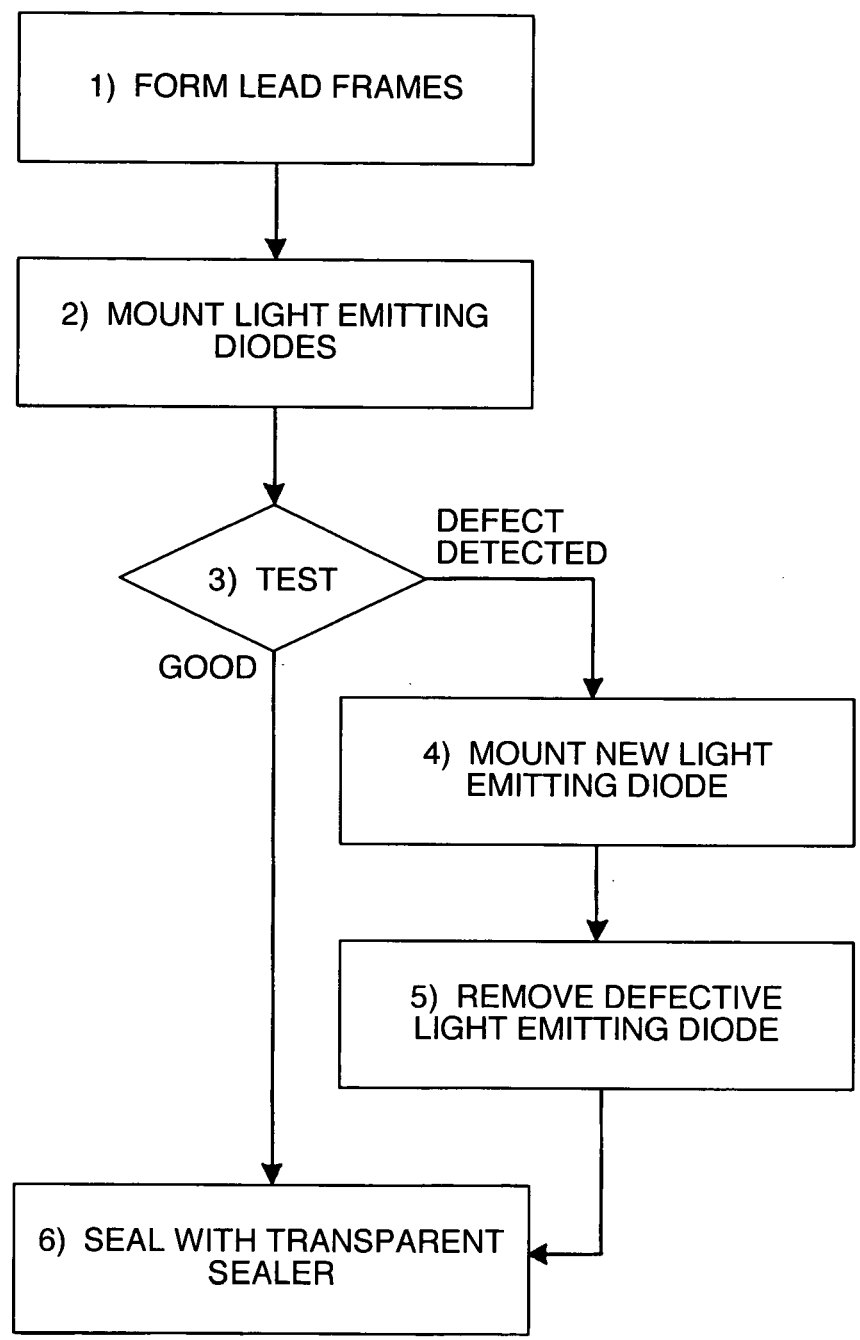

ILLUMINATING APPARATUS, METHOD FOR FABRICATING THE USING THE SAME AND DISPLAY APPARATUS USING THE SAME

CROSS-REFERENCE TO RELATED APPLICATION

The present application is related to U.S. Patent Application entitled "Lighting Source Unit, Illuminating Apparatus Using the Same and Display Apparatus Using the Same" in the name of Ikuo Hiyama, Hiroki Kaneko, Toshiaki Tanaka, Tsunenori Yamamoto, Akitoyo Konno, Katsumi Kondo and Haruo Akahoshi based on Japanese Patent Application No. 2004-320383 filed on Nov. 4, 2004, and U.S. patent application entitled "Illuminating Apparatus and Display Apparatus Using the Same" in the name of Toshiaki Tanaka, Hiroki Kaneko and Ikuo Hiyama, based on Japanese Patent Application No. 2004-320136 filed on Nov. 4, 2004.

BACKGROUND OF THE INVENTION

The present invention relates to an illuminating apparatus using light emitting diode chips, a method for fabricating the illuminating apparatus, and a display apparatus which uses the illuminating apparatus as a back light for a non-light emitting display panel.

An improved light emitting efficiency of recent light emitting diodes (LED) drives an ever replacement of light sources for a variety of illuminating apparatuses from fluorescent lamps to light emitting diodes. This is because the light emitting diodes have many features such as smaller size, ability to generate multiple colors, ease of control, low power consumption and the like. However, since light output of a single light emitting diode is still insufficient in applications which require high light outputs, a plurality of light emitting diodes are arrayed to make up an illuminating apparatus.

For example, in a liquid crystal display, an illuminating apparatus is made up of an array of plural light emitting diode packages, which emit light red, green, and blue light, respectively, for use as a back light, as described in SID03 Digest, pp. 1262-1265 (2003). Also, as described in SID04 Digest, pp. 1222-1225 (2004), a red, a green, and a blue light emitting diode are disposed in the same package, a plurality of which are arranged in combination with light guiding plates to build an illuminating apparatus which is used as a back light. Further, a signal light for automobile, for example, employs an illuminating apparatus which has light emitting diodes mounted on a series of lead frames, as described in JP-A-8-339707.

However, when light emitting diodes are packaged and a plurality of the resulting packages are arrayed as described in SID03 Digest, pp. 1262-1265 (2003) and SID04 Digest, pp. 1222-1225 (2004), each package must be again mounted on a printed circuit board by soldering or the like, thus causing an increased cost for the mounting.

On the other hand, when a plurality of light emitting diodes are arrayed on a series of lead frames as described in JP-A-8-339707, the mounting cost can be reduced because the light emitting diodes are connected to the lead frames at a smaller number of spots. However, since a plurality of light emitting diodes are mounted on a series of lead frames such that they are electrically connected in series, all of the plurality of light emitting diodes are regarded as defective and discarded if even one light emitting diode is involved in defective mounting or is defective per se. Therefore, the yield rate is lower when light emitting diodes are mounted on a series of lead frames, as compared with package-by-package mounting on a printed circuit board.

SUMMARY OF THE INVENTION

It is an object of the present invention to provide a low-cost illuminating apparatus which has a reduced number of mounting spots by soldering or the like, and is capable of increasing the yield rate, a method for fabricating the illuminating apparatus, and a display apparatus using the illuminating apparatus.

To achieve the above object, an illuminating apparatus of the present invention has light emitting diodes, lead frames, and a transparent sealer. N light emitting diodes, N sets of lead frames mounted with the N light emitting diodes, and one or more sets of lead frames each not mounted with a light emitting modules are sealed by the transparent sealer for integration into a modular illuminating apparatus.

Also, to achieve the other object, the present invention provide a method for fabricating the illuminating apparatus. The method includes a light emitting diode mounting step of mounting the light emitting diodes on the lead frames, a light emitting diode sealing step of sealing the light emitting diodes mounted on the lead frame with the transparent sealer, a testing step between the light emitting diode mounting step and the light emitting diode sealing step for testing at least a light emitting state and a mounting state of the light emitting diodes, and a light emitting diode re-mounting step of newly mounting a light emitting diode at a location of the lead frame at which the light emitting diode is not mounted when a defect is determined in the testing step.

Also, to achieve the other object, the present invention provides a display apparatus which includes the illuminating apparatus used as a back light for a non-light emitting display panel.

With the foregoing configuration, the present invention can accomplish an illuminating apparatus which has a reduced number of mounting spots by soldering or the like to permit an increased yield rate and a reduced cost, a method for fabricating the illuminating apparatus, and a display apparatus using the illuminating apparatus.

Other objects, features and advantages of the invention will become apparent from the following description of the embodiments of the invention taken in conjunction with the accompanying drawings.

BRIEF DESCRIPTION OF THE DRAWINGS

FIG. 1A shows a top plan view of the illuminating apparatus, and FIG. 1B shows a cross-sectional view taken along a line A-A' in FIG. 1A FIGS. 2A-2C are diagrams for describing a variety of methods of mounting a light emitting diode on a lead frame;

FIG. 3 is a process diagram for describing a method for fabricating the illuminating apparatus of the present invention;

FIG. 15A is a top plan view, and FIG. 15B is a cross-sectional view taken along a line B-B' in FIG. 15A;

DETAILED DESCRIPTION OF THE EMBODIMENTS

In the following, several embodiments of an illuminating apparatus, a method for fabricating the illuminating apparatus, and a display apparatus using the illuminating apparatus according to the present invention, will be described in detail with reference to the accompanying drawings.

First Embodiment

Figure 1A:
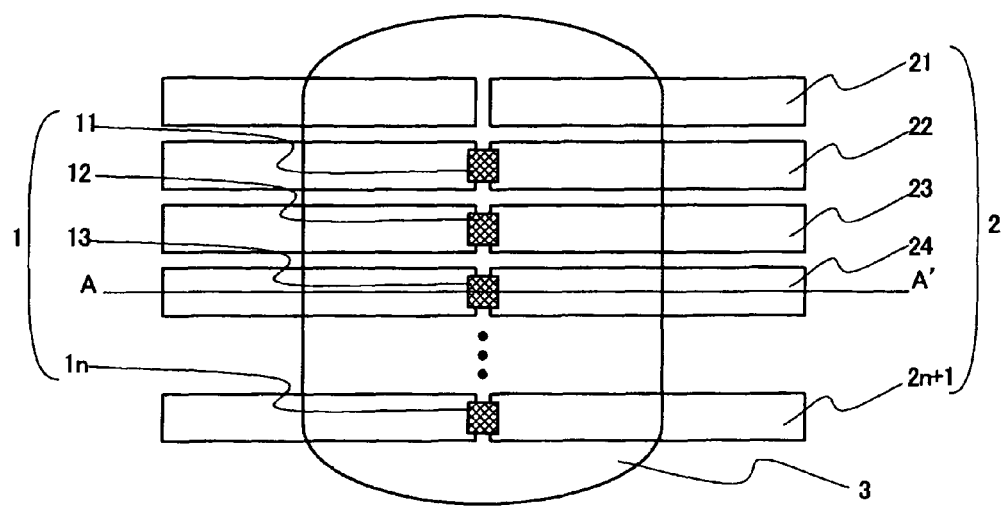
FIGS. 1A and 1B are diagrams for describing an illuminating apparatus according to a first embodiment of the present invention, where
Figure 1B:
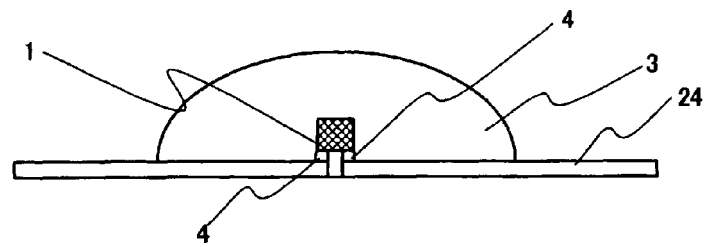

FIGS. 1A and 1B are diagrams for describing an illuminating apparatus according to a first embodiment of the present invention, where FIG. 1A shows a top plan view of the illuminating apparatus, and FIG. 1B shows a cross-sectional view taken along a line A-A' in FIG. 1A. The illuminating apparatus of the first embodiment comprises N (N is an integer equal to or larger than one) light emitting diodes 1 (11-1$n$); (N+1) sets or more of lead frames 2 (21-2$n$+1); and a transparent sealer 3. FIG. 1 illustrates (N+1) sets of the lead frames 2. Each light emitting diode 1 is mounted on the lead frame 2 with solder 4. Then, the light emitting diodes 1 mounted on the lead frames 2 are sealed by the transparent sealer 3. In the first embodiment, the transparent sealer 3, and the light emitting diodes 1 and lead frames 2 sealed by the transparent sealer 3 are collectively referred to as a "module" which constitutes one unit. In FIG. 1, one module forms an illuminating apparatus.

In the illuminating apparatus of the first embodiment, a predetermined voltage is applied between both ends of each of the lead frames 22-2$n$+1 mounted with the light emitting diodes 11-1$n$ to apply a current therethrough, thereby causing the light emitting diodes 11-1$n$ to emit light. The color of light emitted by the light emitting diode 1 can be varied by changing the composition, structure, manufacturing method and the like of semiconductor layers which make up the light emitting diode, and an arbitrary color can be selected from the whole range of visible light. In addition, light emitting diodes which emit several different colors from one another can be provided such that their light is mixed to create light in a new color. Further, a fluorescent material may be disposed around a light emitting diode to mix light emitted by the light emitting diode with light emitted by the fluorescent material, for example, to mix blue light from a light emitting diode with yellow light from a fluorescent material to emit white light. They can be arbitrarily selected in accordance with a particular application of the illuminating apparatus.

Figure 2A:
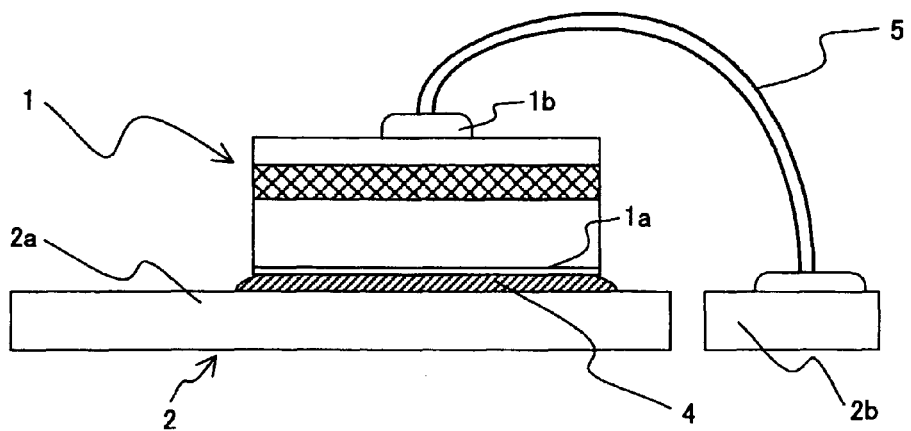
Figure 2B:
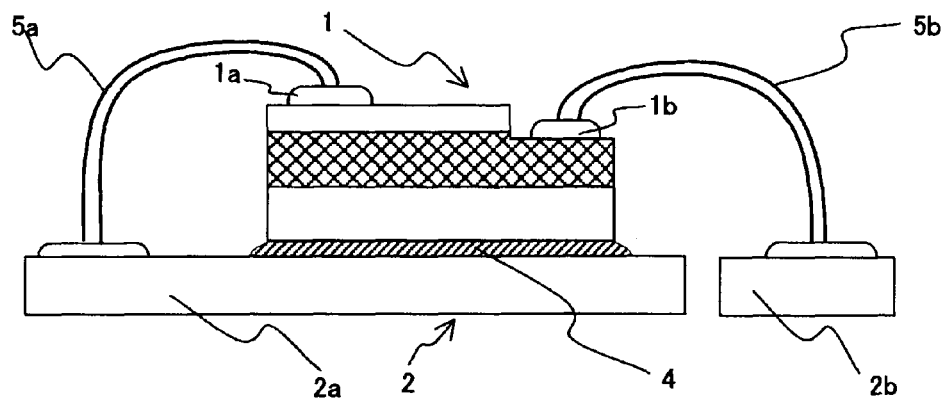
Figure 2C:
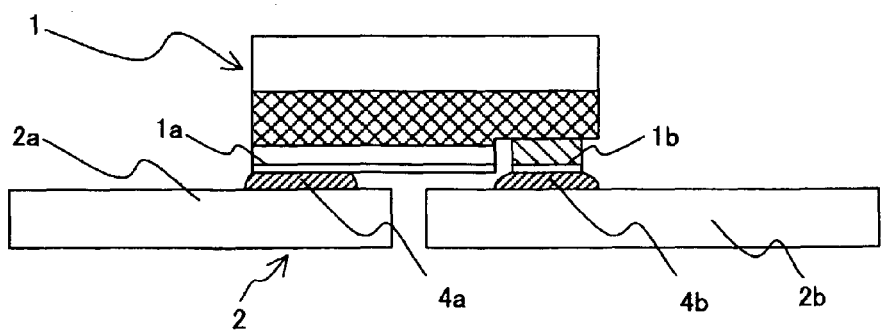

FIGS. 2A-2C are schematic side views for describing a variety of embodiments of light emitting diodes for use in the illuminating apparatus of the first embodiment. The light emitting diodes 1 can be classified into three types, as shown in FIGS. 2A-2C, according to the positioning of two electrodes thereof, in other words, how the light emitting diode 1 is mounted on the lead frame 2. FIG. 2A illustrates a light emitting diode which has electrodes on its top (opposite to the lead frame 2) and bottom (facing the lead frame 2) surfaces. The electrode on the bottom surface is electrically connected to one piece 2$a$ of a lead frame 2 by solder 4, while the electrode on the top surface is electrically connected to an adjacent piece 2$b$ of the lead frame 2 by a bonding wire 5. The solder 4 may be replaced by a variety of conductive pastes which satisfy the conductivity and the function of fixing a light emitting diode, similar to the solder, an anisotropic conductive paste which has the conductivity only in an arbitrary direction, these conductive pastes formed into a sheet, or the like.

FIG. 2B illustrates a light emitting diode which has electrodes at two locations on the top surface. The light emitting diode 1 itself is fixed to the lead frame 2 by solder 4. The electrodes 1$a$, 1$b$ on the top surface of the light emitting diode 1 are electrically connected to lead frame pieces 2$a$, 2$b$ adjacent to each other by bonding wires 5$a$, 5$b$, respectively. Also, the light emitting diode 1 is electrically fixed to the one and the other pieces 2$a$, 2$b$ of the lead frame 2. Since no conductivity is required for fixing the light emitting diode 1 to the lead frame 2, a non-conductive adhesive may be used instead of the solder 4.

FIG. 2C illustrates a light emitting diode which has electrodes at two locations on the bottom surface. The respective electrodes 1$a$, 1$b$ on the bottom surface are electrically connected and fixed to adjacent lead frame pieces 2$a$, 2$b$ of the lead frame 2 by solder 4$a$, 4$b$, respectively. FIG. 1 illustrates, by way of example, the light emitting diodes 1 in the form shown in FIG. 2C, i.e., those which have the electrodes at two locations on the bottom surface, connected to the lead frame pieces 2$a$, 2$b$ by the solder 4. In the following description, including other embodiments, the form of mounting the light emitting diode illustrated in FIG. 2C is given as an example, but any of the light emitting diodes mounted in the forms illustrated in FIGS. 2A-2C may be used unless otherwise noted.

The lead frame 2 is formed by stamping or etching a metal reglet of approximately 0.1 mm to 3.0 mm thick or a contour strip having a thicker area and a thinner area. A material used for the lead frame 2 may be copper, an alloy mainly containing copper, an iron-nickel alloy, or the like. Since a majority of power applied to a light emitting diode converts to heat which reduces the light emitting efficiency, copper which has a high thermal conductivity or an alloy mainly containing copper is preferably used at any cost in view of the light emitting efficiency and reliability.

In addition, silver or gold may be plated on the surface of the lead frame 2 to improve the reliability of mounting. Moreover, such plating advantageously contributes to an improvement in the light utilization efficiency of the illuminating apparatus because light emitted from the light emitting diode 1 efficiently reflects on the plated surface of the lead frame 2 when it is incident thereon. This type of plating includes entire plating, linear plating, spot plating, and the like, any of which may be used for the lead frame 2. In the following description, including other embodiments, no reference will be particularly made as to whether or not the surface of the lead frame is plated, unless otherwise noted. Also, with regard to the shape of the lead frame, the lead frame described below will basically have the shape of the most simplified rectangle, unless otherwise noted, but it should be understood that the lead frame may be formed in any other shape.

The transparent sealer 3 can be made of a variety of transparent resins, and can be formed by injection molding, transfer molding, potting, a variety of printing methods, and the like. The transparent sealer 3 preferably has a high transparency, a resistance to heat and light, and a low moisture permeability. The transparent sealer 3 may be shaped into a convex or a concave lens which effectively converges or scatters light radiated by the light emitting diode. Further, the transparent sealer 3 may be mixed with beads having different indexes of refraction to improve the diffusion, thereby improving the uniformity and the efficiency of extracting the light from the light emitting diodes. A transparent sealer containing the diffusion beads and a transparent sealer not containing the diffusion beads may laminated for use in the sealing. In the following description of the present invention, including other embodiments, the transparent sealer used in a single layer is given as an example, but any of the foregoing transparent sealers may be used.

FIG. 3 is a process diagram for describing a method for fabricating the illuminating apparatus according to the present invention. For fabricating the illuminating apparatus of the present invention illustrated in FIG. 1, (1) a reglet, which is the source material of the lead frames, is first stamped to form (N+1) sets of lead frames 2. Next, (2) N light emitting diodes 1 are mounted on the lead frames 2 by solder 4. Next, (3) a power supply is connected to each lead frame 2 and applies a predetermined voltage thereto to cause the light emitting diodes 1 to emit light for testing their light emitting states and mounting states by a testing apparatus, viewing or the like. Here, when the result of the test is acceptable, (6) the light emitting diodes 1 and lead frames 2 are sealed by the transparent sealer 3 to complete the illuminating apparatus of the present invention.

On the other hand, if the test at step (3) results in detection of any light emitting diode which does not satisfy conditions for a predetermined amount of light and a light emitting wavelength due to defective mounting, a defect of the light emitting diode itself, and the like, (4) light emitting diodes are newly mounted on a lead frame which has no light emitting diode mounted thereon, so that a total light amount similar to that of a conforming product can be emitted from the module, because sets of lead frames of the present invention have been previously formed in a number larger than the number of light emitting diodes to be mounted. In this event, (5) since the light emitting diode determined as defective is removed, it is possible to prevent a current leaking through the defective light emitting diode, and the generation of heat caused by a defective contact and the like, thus making it possible to use the illuminating apparatus in a highly reliable state.

It is contemplated that after removing a light emitting diode which is determined as defective in the testing step, a different light emitting diode may be again mounted at the same location. However, the re-mounting is quite difficult due to a possible failure in completely removing the solder on the lead frame from which the light emitting diode has been removed, the plating which can peel, and the like. In the present invention, since a new light emitting diode is not mounted at a location from which a defective light emitting diode has been removed, the light emitting diode can be readily removed without paying attention to roughness on the surface of the lead frame, caused by remaining solder, peeling plating and the like, during the removal. After the testing step, (6) the light emitting diodes 1 and lead frames 2 are sealed by the transparent sealer 3 through the step of mounting a new light emitting diode, thus completing the illuminating apparatus of the present invention.

According to the fabricating method of the present invention, the illuminating apparatus is fabricated in the process which introduces the testing step between the light emitting diode mounting step and the sealing step using the transparent sealer, as described above. In addition, extra lead frames have been formed such that new light emitting diodes can be mounted thereon if any defect is found in the testing step, thus making it possible to effectively increase the yield rate during the fabrication of the illuminating apparatus and reduce the cost of the illuminating apparatus.

In the foregoing embodiment, when a defect is found in the testing step, the fabricating method described above first mounts a new light emitting diode and then removes a defective light emitting diode. Alternatively, these two steps can be reversed in order without causing any problem. Also, in the foregoing embodiment, the number of sets of lead frames is larger by one than light emitting diodes mounted thereon, but it should be understood that, as long as there is no limitations in stocking place, the provision of more lead frames would further improve the yield rate during the fabrication of the illuminating apparatus and reduce the cost of the illuminating apparatus.

Second Embodiment

Figure 4:
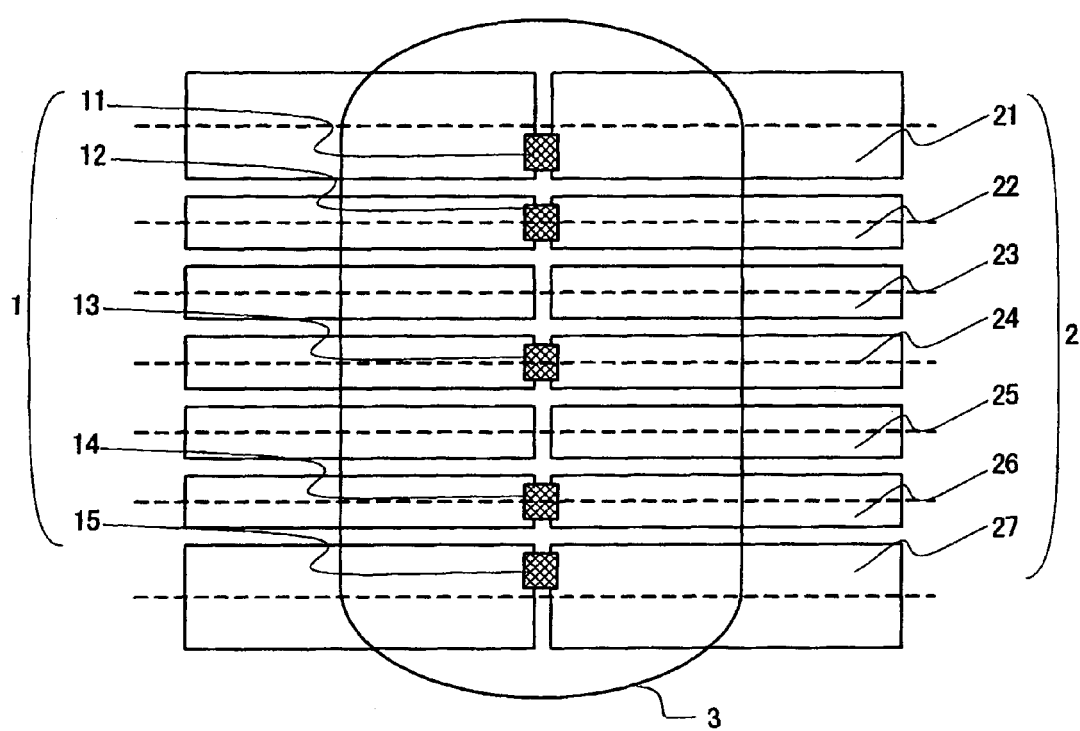
FIG. 4 is a top plan view for describing an illuminating apparatus according to a second embodiment of the present invention.

FIG. 4 is a top plan view for describing an illuminating apparatus according to a second embodiment of the present invention. The illuminating apparatus of the second embodiment comprises N (N is an integer equal to or more than four) light emitting diodes 1, (2N−3) sets of lead frames 2, and a transparent sealer 3, where there are (N−3) sets of lead frames 2 which are not mounted with the light emitting diodes 1. FIG. 4 illustrates the illuminating apparatus which comprises five light emitting diodes (11, 12, 13, 14, 15) (N=5), and therefore seven sets of lead frames (21, 22, 23, 24, 25, 26, 27). In FIG. 4, the outermost lead frames 21, 27 are mounted with the light emitting diodes 11, 15, respectively, where they are mounted in an upper half area or a lower half area from the center lines (broken lines in FIG. 4) of the lead frames 21, 27, respectively. In addition, each of the light emitting diodes 12-14 mounted on the inner lead frames 22-26 straddles the center line of the associated lead frame. Here, the center line is defined as follows.

FIGS. 5A-5C and 6A-6C are diagrams for describing locations at which the light emitting diodes should be mounted in the illuminating apparatus according to the second embodiment of the present invention. When one set of lead frame pieces (one piece 2a and the other piece 2b of the lead frame 2, which may be called "one set of lead frame pieces 2a, 2b" in some cases) are placed side by side in the x-direction (horizontal direction in FIG. 5A) as illustrated in a top plan view of FIG. 5A, portions of one set of lead frame pieces (2a, 2b) which form a gap therebetween and run in parallel with each other are respectively projected onto arbitrary lines parallel with the y-axis (vertical direction in FIG. 5). In this event, the center line is defined by a line (broken line in FIG. 5) which is drawn to cut in half the height of a portion (indicated by a double headed arrow in FIG. 5) in which a projected image 2aa of the one lead frame piece 2a overlaps with a projected image 2bb of the other lead frame piece 2b.

Figure 5A:
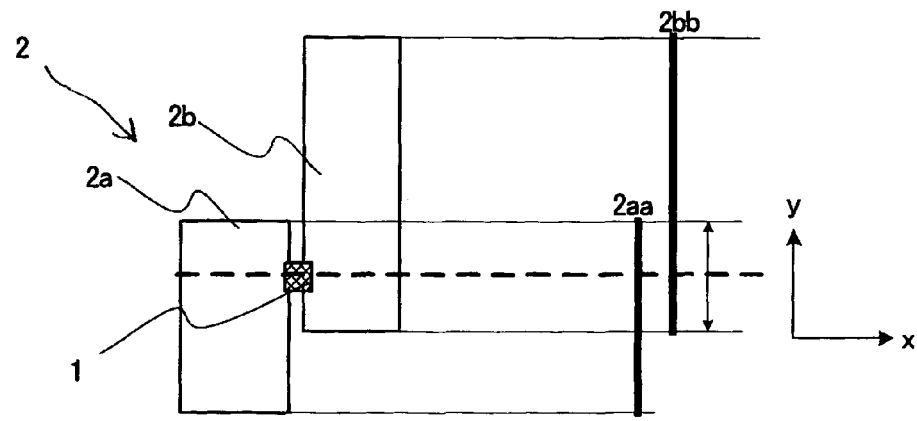
FIGS. 5A-5C are diagrams for describing locations at which the light emitting diodes are mounted in the illuminating apparatus according to the second embodiment of the present invention.
Figure 5B:
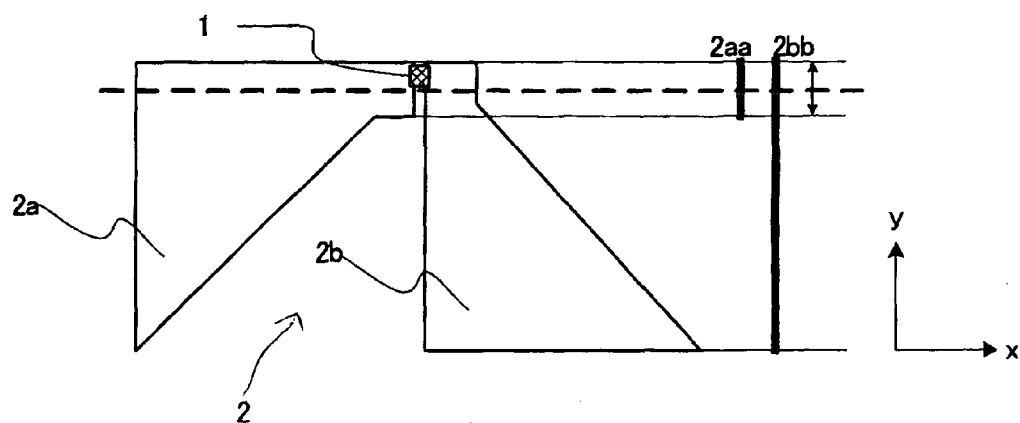
Figure 5C:
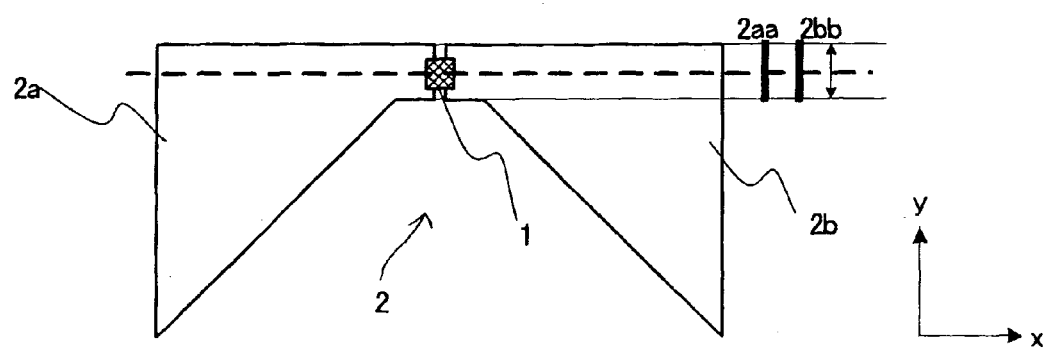
Figure 6A:
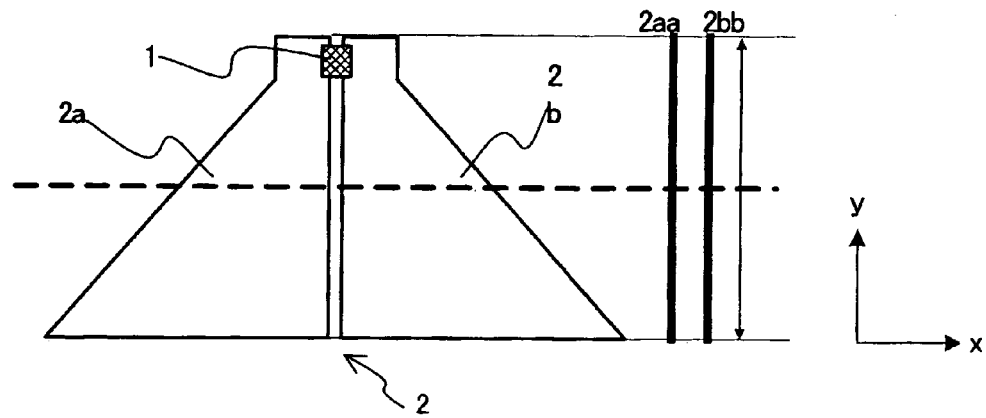
FIGS. 6A-6C are diagrams for describing locations at which the light emitting diodes are mounted in the illuminating apparatus according to the second embodiment of the present invention.
Figure 6B:
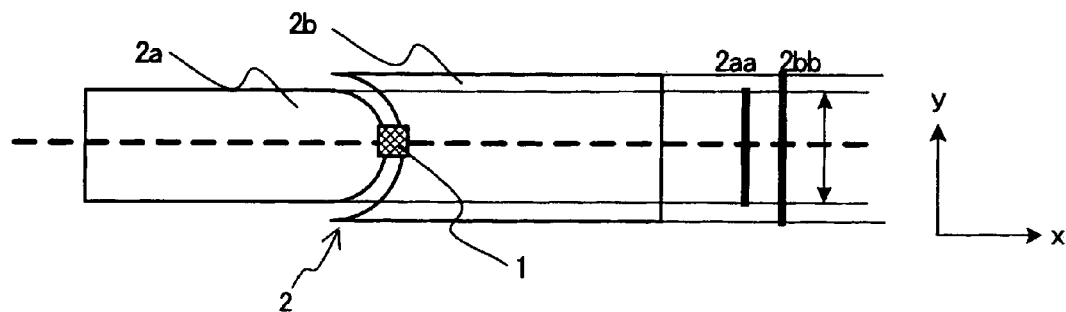

For example, even when a set of substantially triangular lead frame pieces (2a, 2b) is formed as shown in FIGS. 5B, 5C and 6A, the center line can be defined in a similar manner to the foregoing. Also, for example, even when a set of lead frame pieces (2a, 2b) forms a gap defined by concentric curves as shown in FIG. 6B, the center line can be defined by projecting the lead frame pieces 2a, 2b in a similar manner to the foregoing. When the projected image 2aa of the one lead frame piece 2a to an arbitrary line parallel with the y-axis is lost in the middle, as shown in FIG. 6C, the center line is determined by a similar definition to the foregoing on the assumption that the projected image exists even in the lost portion.

Figure 6C:
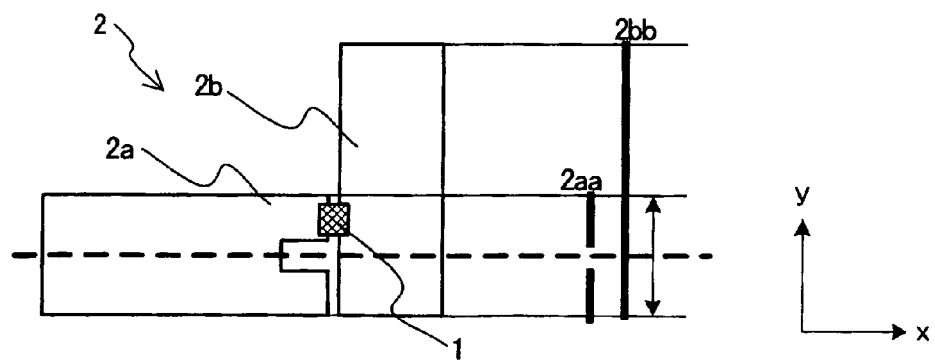

FIGS. 5A, 5C, 6B show that the light emitting diode 1 is mounted over the center line, while FIGS. 5B, 6A, 6C show that the light emitting diode 1 is mounted in the area above the center line.

The illuminating apparatus of the second embodiment can be fabricated through similar steps to those in the first embodiment described above, and the illuminating apparatus of FIG. 4 can be formed when it is determined as a conforming product in the testing step. On the other hand, if a defective light emitting diode is determined in the testing step, a new light emitting diode is mounted by a method which will be described below with reference to FIG. 7.

Figure 7:
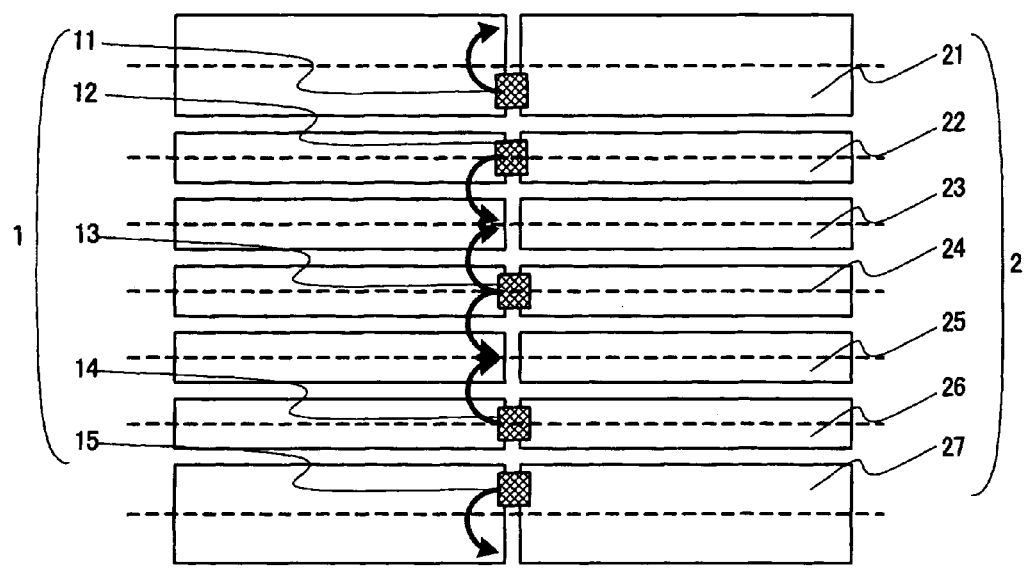
FIG. 7 is a top plan view for describing the state of the illuminating apparatus according to the present invention before sealing in the second embodiment.
Figure 8:
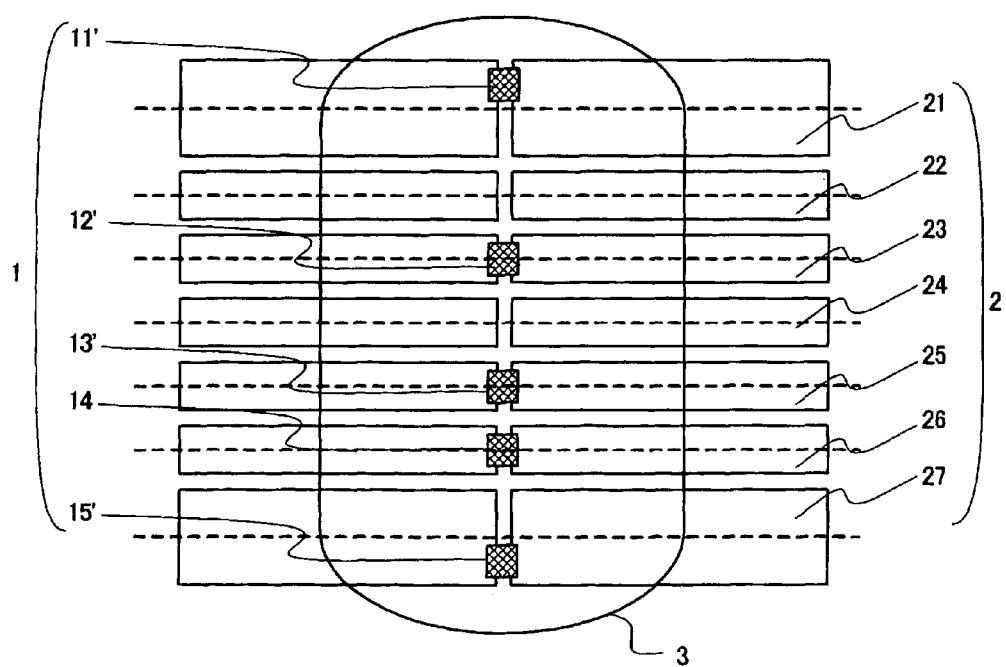
FIG. 8 is a top plan view for describing the state of the illuminating apparatus of the present invention after sealing in the second embodiment.

FIG. 7 is a top plan view for describing the state of the illuminating apparatus according to the present invention before the sealing step in the second embodiment. FIG. 8 is a top plan view for describing the state of the illuminating apparatus of the present invention after the sealing step in the second embodiment. In FIG. 7, if a light emitting diode 11, for example, is determined as defective in the testing step, a new light emitting diode is mounted in an upper half area above the center line (broken line in FIG. 7) of a lead frame 21. On the other hand, if a light emitting diode 12 is determined as defective in the testing step, a new light emitting diode is mounted on a lead frame 23. If a light emitting diode 13 is determined as defective in the testing step, a new light emitting diode is mounted on either a lead frame 23 or 25. If a light emitting diode 14 is determined as defective in the testing step, a new light emitting diode is mounted on a lead frame 26. Then, if a light emitting diode 15 is determined as defective in the testing step, a new light emitting diode is mounted in a lower half area below the center line of a lead frame 27.

FIG. 8 illustrates the illuminating apparatus after new light emitting diodes have been mounted and sealed by the transparent sealer 3 when the light emitting diodes 11, 12, 13, 15 fail simultaneously. In this embodiment, even if defects are detected simultaneously in four light emitting diodes at maximum within one module, they can be repaired by providing seven lead frames for five light emitting diodes.

The illuminating apparatus of this embodiment is configured as described above, wherein one set of lead frames 23, which are not mounted with light emitting diodes, is provided for two light emitting diodes 12, 13 in FIG. 7, and one set of lead frames 25, which are not mounted with light emitting diodes, is provided for two light emitting diodes 13, 14 as spare lead frames on which a light emitting diodes can be mounted if a defective light emitting diode is detected, thus advantageously repairing a large number of defects with a small number of lead frames. In the configuration as described above, since the light emitting diodes are not unnecessarily spaced apart from each other, light from the respective light emitting diodes can be mixed with one another in a satisfactory way. While the foregoing embodiment has been described in connection with the illuminating apparatus which has five light emitting diodes (N=5), it should be understood that similar effects can be provided when N is an integer equal to or larger than four.

Third Embodiment

Figure 9:
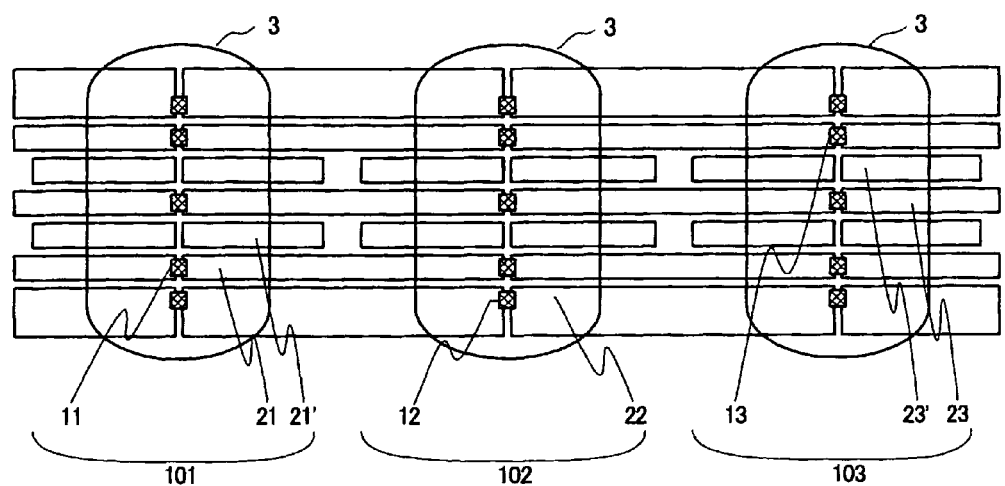
FIG. 9 is a top plan view for describing an illuminating apparatus according to a third embodiment of the present invention.

FIG. 9 is a top plan view for describing an illuminating apparatus according to a third embodiment of the present invention, where three modules of the second embodiment described above are connected in series. Sets of lead frames, on which light emitting diodes of the modules 101, 102, 103 are mounted, are each composed of a series of lead frames which are connected in series.

Figure 10:
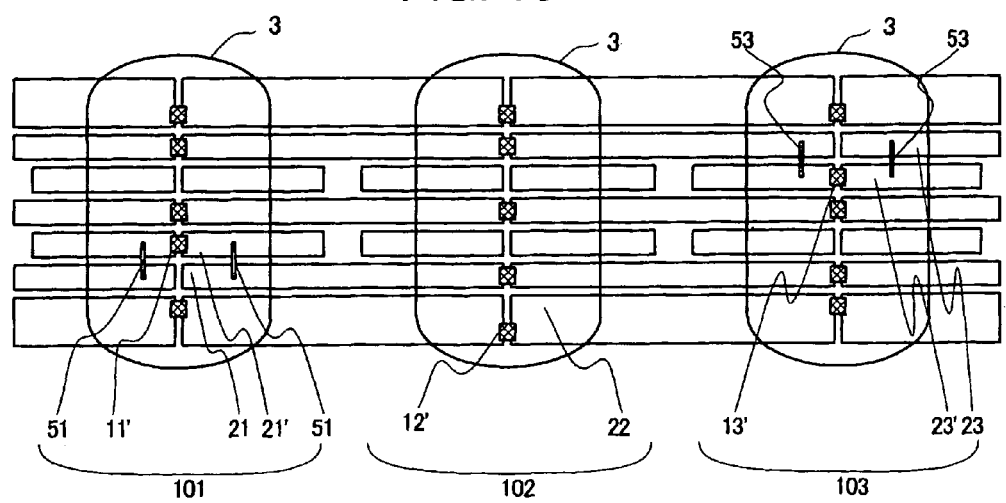
FIG. 10 is a top plan view for describing a method of repairing the illuminating apparatus according to the third embodiment of the present invention.

FIG. 10 is a top plan view for describing a method of repairing the illuminating apparatus according to the third embodiment of the present invention. The illuminating apparatus of the third embodiment can be fabricated by similar steps to those in the first and second embodiments, and the illuminating apparatus can be formed as illustrated in FIG. 9 if all light emitting diodes are determined as conforming in the testing step. On the other hand, if any light emitting diode is determined as defective, a new light emitting diode can be mounted to make the illuminating apparatus conforming, as described below. As an example, referring to FIG. 10, a description will be given of a method of repairing the illuminating apparatus when light emitting diodes 11, 12, 13 in FIG. 9 are found as defective in the testing step.

When the light emitting diode 11 fails, a light emitting diode 11' is newly mounted on a lead frame 21'. In this embodiment, three modules 101, 102, 103 are electrically connected in series through a series of lead frames. Thus, the repairs are completed by connecting the lead frame 21' to the lead frame 21, on which the light emitting diode has been originally mounted, through two wires 51. When the light emitting diode 12 fails, this is repaired by mounting a light emitting diode 12' in a lower half area below the center line on a lead frame 22. When the light emitting diode 13 fails, a light emitting diode 13' is newly mounted on a lead frame 23'. In this embodiment, the three modules are electrically connected in series through a series of lead frames. Thus, the repairs are completed by connecting the lead frame 23' to the lead frame 23, on which the light emitting diode 13 has been originally mounted, through two wires 53.

This embodiment is suitable for an illuminating apparatus which has a large number of light emitting diodes mounted on a series of collectively formed lead frames, and advantageously increases the yield rate, which has been conventionally lower as a more number of light emitting diodes are mounted, to reduce the cost. Also, while the foregoing embodiment has shown an example in which three modules are connected in series, it should be understood that similar effects can be provided when two or more modules are connected in series.

Fourth Embodiment

Figure 11:
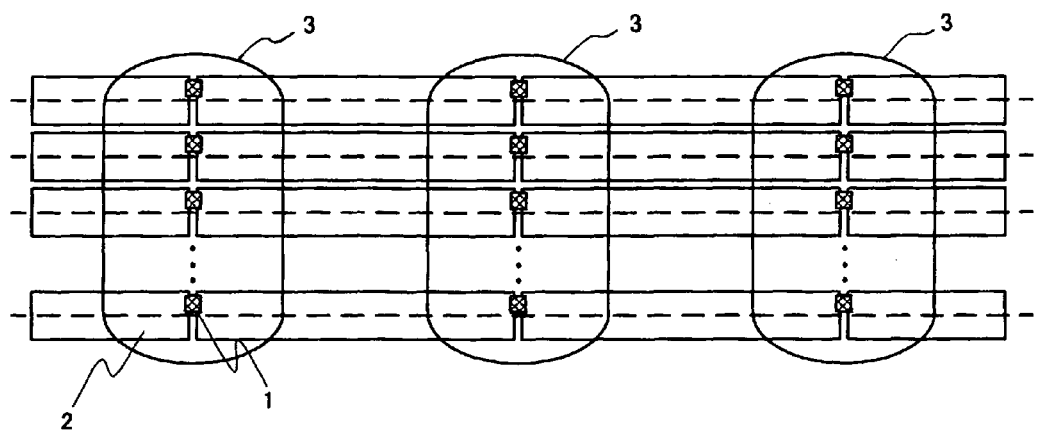
FIG. 11 is a top plan view for describing an illuminating apparatus according to a fourth embodiment of the present invention.

FIG. 11 is a top plan view for describing an illuminating apparatus according to a fourth embodiment of the present invention. FIG. 11 illustrates three modules connected through a series of lead frames, where each module has N (N is an integer equal to or larger than one) light emitting diodes mounted thereon. The light emitting diode 1 of this embodiment is mounted in an upper half area above or a lower half area below the center line (indicated by a broken line in FIG. 11) of each lead frame 2. FIG. 11 shows an example in which each light emitting diode is mounted in the upper half area above the center line. The illuminating apparatus of this embodiment can be fabricated by similar steps to those in the first embodiment, and the illuminating apparatus of FIG. 11 can be formed when all the light emitting diodes mounted therein are determined as conforming. On the other hand, if any light emitting diode is found as defective in the testing step, a new light emitting diode is mounted in the lower half area of an associated lead frame if the defective light emitting frame has been mounted in the upper half area of the lead frame, and mounted in the upper half area of the lead frame if the defective light emitting frame has been mounted in the lower half area of the lead frame.

The illuminating apparatus of this embodiment advantageously dissipates heat in an effective manner, prevents a reduction in light emitting efficiency, and improves the reliability because each lead frame used herein has a large width for the light emitting diode, in addition to the advantageous reduction in cost resulting from the increased yield rate. While the foregoing embodiment has shown an example in which three modules are connected in series, it should be understood that similar effects can be provided when two or more modules are connected in series.

Fifth Embodiment

Figure 12:
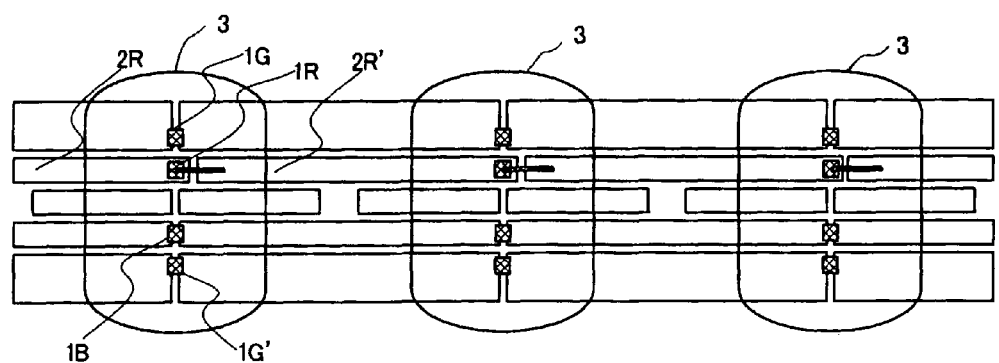
FIG. 12 is a top plan view for describing an illuminating apparatus according to a fifth embodiment of the present invention.

FIG. 12 is a top plan view for describing an illuminating apparatus according to a fifth embodiment of the present invention, where three modules are connected through a series of lead frames. The fifth embodiment is similar in structure to the third embodiment which has four light emitting diodes (N=4) in each module. Each module is mounted with four light emitting diodes 1G, 1R, 1B, 1G', where 1G, 1G' emit light in green; 1R in red; and 1B in blue, respectively. FIG. 12 shows, as an example, that the light emitting diode 1R, which emits red light, has electrodes, one of which is positioned on the top surface, and the other of which is positioned on the bottom surface. In this embodiment, a gap between one set of lead frames 2R, 2R' is shifted to the left in FIG. 12, with respect to the gaps between other lead frames, such that the position at which the light emitting diode is mounted does not shift in the horizontal direction in FIG. 12.

By arranging the light emitting diodes in the foregoing manner, the orientation of light can be made uniform irrespective of whichever form is used for mounting the light emitting diodes. Also, while white light can be produced by mixing green, red, and blue light in a well balanced manner, current light emitting diodes suffer from a low light emitting efficiency for green light. For this reason, satisfactory white light can be produced by mounting two green light emitting diodes per module as in this embodiment. Also, when two green light emitting diodes are mounted per module as in this embodiment, they may be mounted on the outer lead frames to well mix the colored light.

Figure 13:
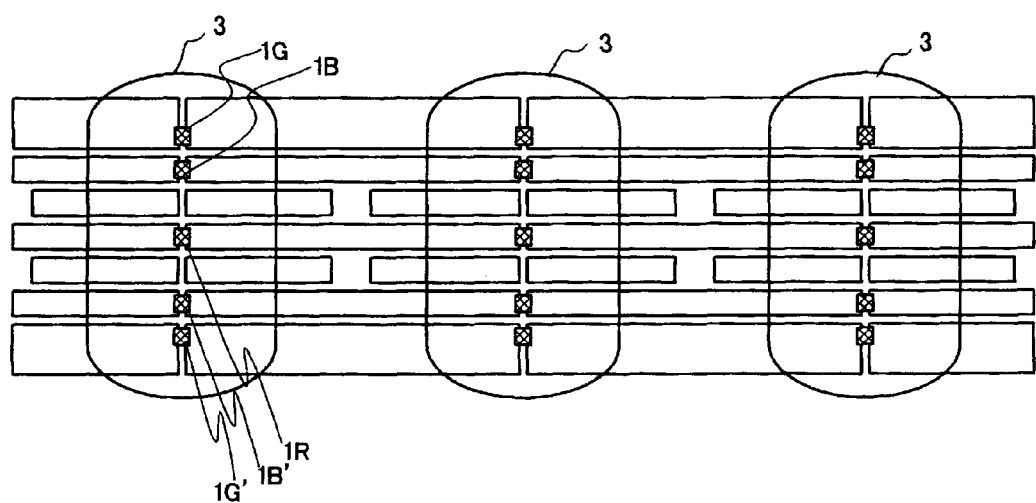
FIG. 13 is a top plan view for describing an exemplary modification to the illuminating apparatus according to the fifth embodiment of the present invention.

FIG. 13 is a top plan view for describing an exemplary modification to the illuminating apparatus according to the fifth embodiment of the present invention. As illustrated in FIG. 13, an extra light emitting diode 1B' is added to each module, so that good white light can be produced as well with two green light emitting diodes, two blue light emitting diodes, and one red light emitting diode. Likewise, in this modification, two light emitting diodes emitting light in the same color, such as 1G, 1G' and 1B, 1B' are mounted on outer lead frames such that they are in a symmetric relationship in the vertical direction in FIG. 13 and they sandwich the single red light emitting diode 1R, thereby advantageously mixing the colors in a satisfactory manner. While the foregoing embodiment has shown an example in which three modules are connected in series, it should be understood that similar effects can be provided as well when one single module or four or more modules are connected.

Sixth Embodiment

FIG. 14 is a top plan view for describing an illuminating apparatus according to a sixth embodiment of the present invention. The sixth embodiment employs the light emitting diodes which have electrodes at two locations on the bottom surface thereof, wherein the respective electrodes are electrically connected and fixed to two adjacent lead frame pieces 2a, 2b, respectively. The mounting of the light emitting diode 1 having two electrodes on the bottom surface thereof causes the light emitting diode 1 itself to straddle the spacing between the two lead frame pieces 2a, 2b. Therefore, the spacing between the two lead frame pieces 2a, 2b is preferably as narrow as possible, whereas a widest possible spacing between the two lead frame pieces 2a, 2b would facilitate the fabrication in consideration of the processing accuracy.

Figure 14A:
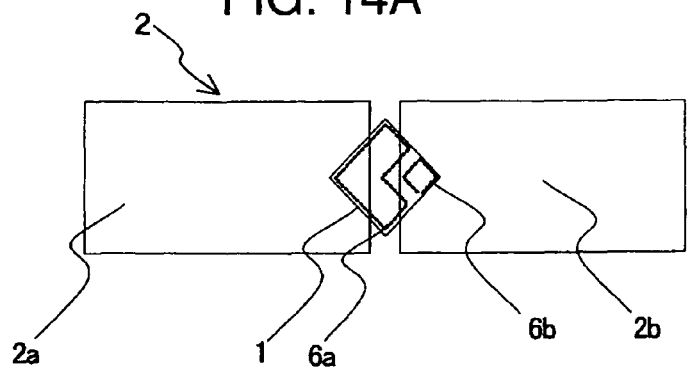
FIGS. 14A-14C are top plan views for describing an illuminating apparatus according to a sixth embodiment of the present invention.

As illustrated in FIG. 14A, the light emitting diode 1 may be mounted in such a manner that the diagonal direction of the light emitting diode 1 is oriented in parallel with one set of lead frame pieces 2a, 2b, and the electrodes 6a, 6b are connected to the lead frame 2 such that the electrodes 6a, 6b are placed on the one and the other pieces 2a, 2b of the lead frame 2, respectively, thereby making it possible to accomplish desired mounting even with a lower processing accuracy of the lead frame 2 or a lower alignment accuracy of the light emitting diode 1 when it is mounted.

Figure 14B:
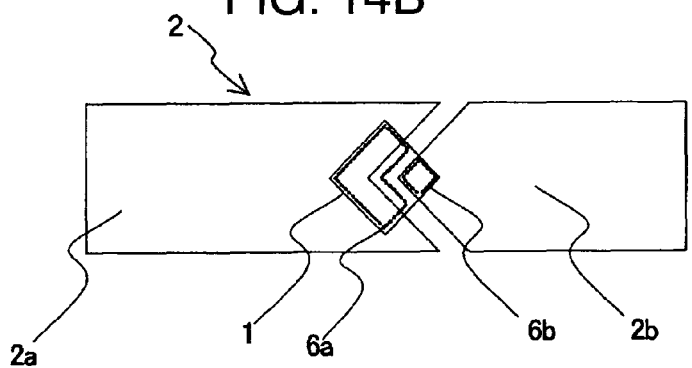
Figure 14C:
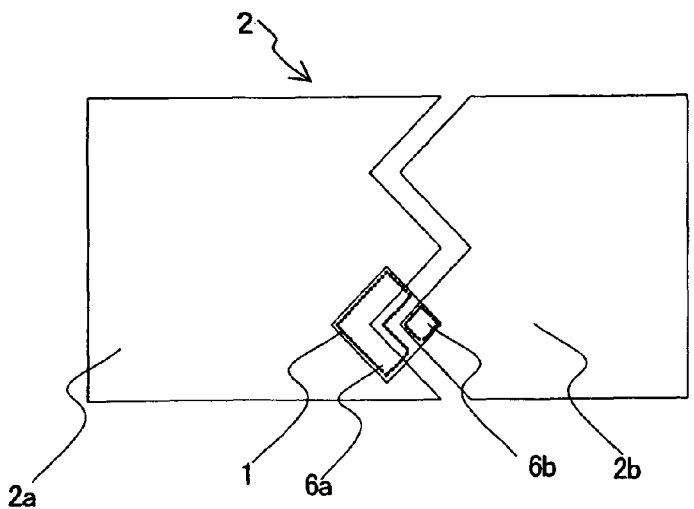

Alternatively, as illustrated in FIG. 14B, the light emitting diode 1 may be mounted such that its diagonal direction is in parallel with the one piece 2a and the other piece 2b of the lead frame 2, and the electrodes 6a, 6b may be connected to the lead frame 2 such that the electrodes 6a, 6b are placed on the one and the other pieces 2a, 2b of the lead frame 2, respectively, in a manner similar to that illustrated in FIG. 14A. Also, one set of the lead frame pieces 2a, 2b of the lead frame 2 may be made such that the opposing edges thereof are formed in a V-shape (for example, with a vertex angle of approximately 270°) and an inverted V-shape (for example, with a vertex angle of approximately 90°), respectively. Further, as illustrated in FIG. 14C, the lead frame pieces 2a, 2b may be formed with two or more V-shaped and inverted V-shaped cuts, respectively.

In the illuminating apparatus of this embodiment, since the shape of the electrodes 6a, 6b of the light emitting diode 1 matches the plane shape of one set of lead frame pieces (2a, 2b), a larger bonding areas can be taken by the soldering than the aforementioned embodiments even with the same processing accuracy of the lead frames 2, thus advantageously improving the reliability for the mounting and increasing the heat dissipation through the solder. Also, in the design illustrated in FIG. 14C, when a failed light emitting diode 1 is confirmed, an extra V-shape and inverted V-shape, formed in the lead frame pieces, can be used to mount a light emitting diode thereon, thus preventing a reduction in the yield rate.

Seventh Embodiment

Figure 15A:
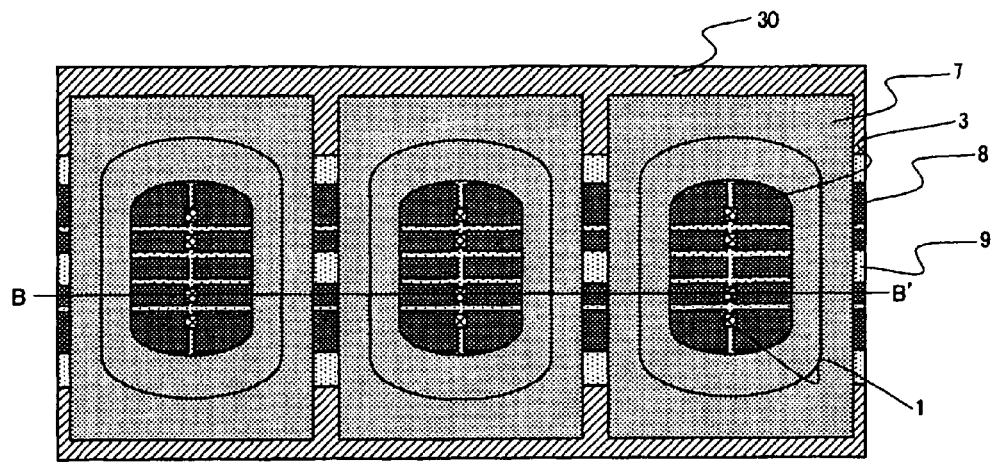
FIGS. 15A and 15B are diagrams for describing an illuminating apparatus according to a seventh embodiment of the present invention, where
Figure 15B:
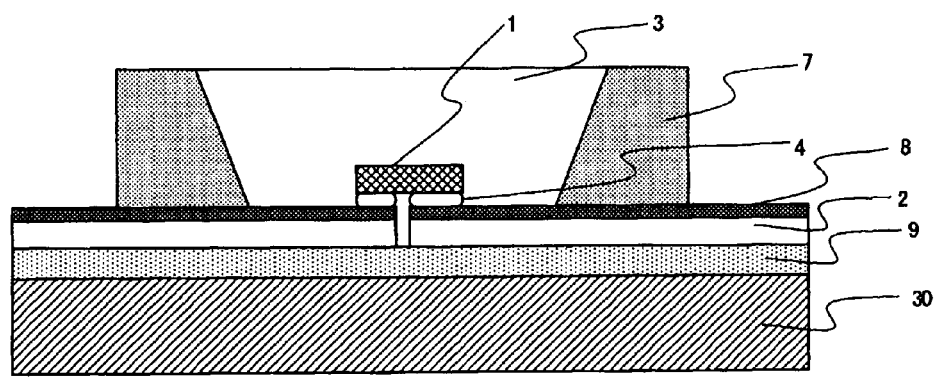

FIGS. 15A and 15B are diagrams for describing an illuminating apparatus according to a seventh embodiment of the present invention, where FIG. 15A is a top plan view, and FIG. 15B is a cross-sectional view taken along a line B-B' in FIG. 15A. The illuminating apparatus of this embodiment comprises a reflector plate 7, an insulating layer 9, and a board 30 in addition to the components of the aforementioned embodiments. The illuminating apparatus of this embodiment can efficiently emit light radiated from the light emitting diode 1 in front by the action of the reflector plate 7. Also, when the reflector plate 7 is made of a diffuse reflective material, colored light from the respective light emitting diodes 1 can be advantageously mixed in a satisfactory manner. The reflector plate 7 may be implemented by a resin- or a ceramic-based mold, or a ring made of a variety of metals, the bottom of which is insulated. Further, a metal thin film may be formed on the surface of these materials by vapor deposition, plating, sputtering or the like to improve the reflectivity.

A silver plating 8 is applied to at least a portion of the lead frame 2 which is in contact with the transparent sealer 3. Advantageously, the plating 8 can reflect light from the light emitting diode 1, diffused light from the reflector plate 7, and reflected light at a high reflectivity to efficiently utilize the light. Also, the insulating layer 9 is disposed on the bottom surface of the lead frame 2, and the board 30 is attached below the insulating layer 9. Here, when the board 30 is made of a metal or a ceramic which has a high coefficient of thermal conductivity, heat generated by the light emitting diode 1 can be efficiently dissipated to the board 30, thus effectively preventing a reduction in the light emitting efficiency, resulting from a rise in the temperature in the light emitting diodes 1, to efficiently utilize the light radiated therefrom. It should be understood that the insulating layer 9 may be removed when an insulating board made of ceramic is used for the heat dissipating board 30.

Eighth Embodiment

Figure 16:
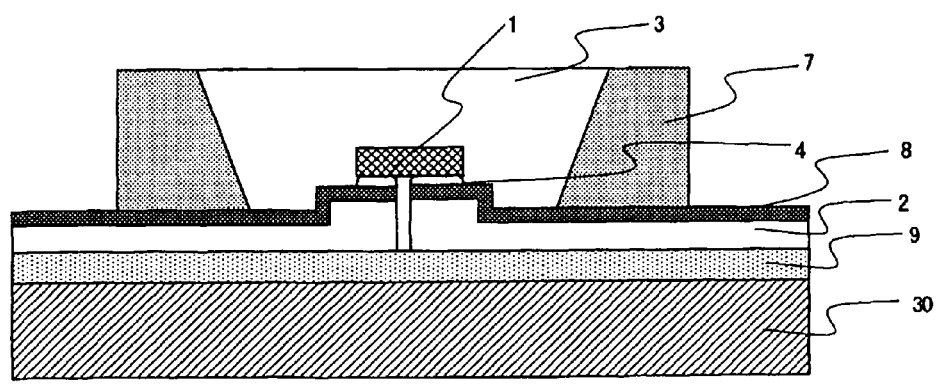
FIG. 16 is a diagram for describing an illuminating apparatus according to an eighth embodiment of the present invention.

FIG. 16 is a diagram for describing an illuminating apparatus according to an eighth embodiment of the present invention. FIG. 16 corresponds to a cross-sectional view taken along the line B-B' in FIG. 15A. The eighth embodiment differs from the seventh embodiment in that the lead frame 2 is made thicker in the area on which the light emitting diode 1 is mounted. The eighth embodiment more effectively dissipates heat generated by the light emitting diode 1 to the lead frame 2. This design of the lead frame 2 including a thicker area can be applied to any of the embodiments which employ a lead frame having a uniform thickness.

In the eighth embodiment, since the light emitting diode 1 is mounted on a plane higher than the bottom surface of the reflector plate 7, the light radiated therefrom is effectively directed to the reflector plate 7 from which the light is reflected toward the top surface. In the eighth embodiment, the light emitting diode 1 is mounted on a plane higher than the bottom surface of the reflector plate 7 with the lead frame 2 which is made thicker in the area on which the light emitting diode 1 is mounted. Alternatively, the lead frame 2 may be bent to mount the light emitting diode 1 on a higher plane to provide similar effects, as a matter of course.

Ninth Embodiment

Figure 17:
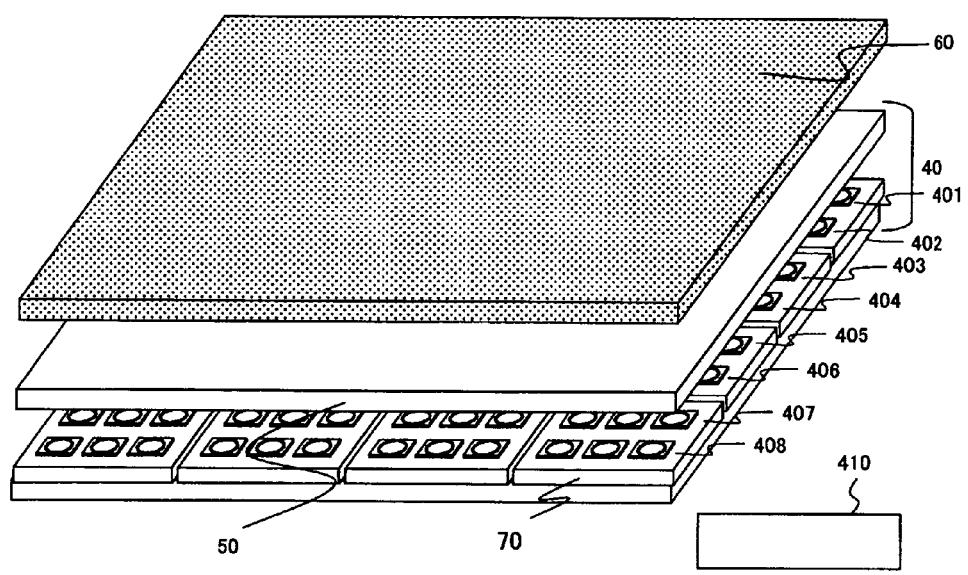
FIG. 17 is a perspective view for describing a display apparatus according to one embodiment of the present invention.

FIG. 17 is a perspective view for describing a display apparatus according to one embodiment of the present invention. The display apparatus of the present invention comprises a so-called back light 40 which comprises a plurality of the light source units 70, each of which has the modules 101, 102, 103 of the illuminating apparatus, as one unit, as described in the respective embodiments of the aforementioned illuminating apparatuses. The display apparatus also comprises optical members 50 for controlling the directivity of light emitted by the back light 40, and a non-light emitting display panel 60. The back light 40 is named after the fact that it is disposed on the back surface (rear surface) of the non-light emitting display panel 60 through the optical members 50.

Giving display modes for illustration, the non-light emitting display panel 60 can operate in a liquid crystal display mode (liquid crystal display panel), an electrophoretic display mode (electrophoretic display panel), an electrochromic display mode (electrochromic display panel), an electronic powder liquid display mode (electronic power liquid display apparatus), and the like, and can utilize all transmission display modes in which the panel itself does not emit light.

The optical members 50 include a diffuser panel, a reflector panel, a prism sheet, a polarized reflector panel, and the like which are utilized individually or in combination as appropriate to accomplish an arbitrary directivity and light uniformity. Further, a reflector panel is preferably disposed on areas other than a light emitting area of the light source unit, such that reflected light from the optical members 50 can be reused to improve the light utilization efficiency.

The display apparatus also comprises an illuminating apparatus driving circuit 410 which can control the brightness of the display apparatus independently for each color row, other than a display control circuit, not shown. The non-light emitting display panel 60 can display arbitrary images and characters by arbitrarily controlling light from the back light 40 to transmit it therethrough or block it thereby on a pixel-by-pixel basis.

Since the display apparatus of the present invention has the back light composed of a plurality of the illuminating apparatuses described above, the back light can be fabricated at a low cost, advantageously leading to a reduction in the cost of the overall display apparatus. Also, in comparison with an illuminating apparatus which employs conventional fluorescent tubes, the light emitting diodes can contribute to improvements in the moving image characteristics of the display apparatus because they response by turning on and off at high speeds. Particularly, when light emitting diodes which emit red, green, and blue light are employed as a back light to create a display apparatus, a wide color reproduction range and a very vivid display can be provided by the resulting display apparatus, as compared with a conventional illuminating apparatus which employs fluorescent tubes. Also, the light emitting diodes have another advantage of harmlessness to the environment because they do not contain mercury.

The respective embodiments have been described in connection with the display apparatus which comprises the non-light emitting display panel 60, and the illuminating apparatus 40 comprised of the light source units two-dimensionally arrayed in a plane and placed on the back surface of the non-light emitting display panel 60 for use as a so-called directly underlying back light. The present invention, however, is not so limited, but may employ a light source comprised of a plurality of colors of light emitting diodes, similar to those in the embodiments, arranged in one dimension, which may be combined with a light guiding plate to provide a so-called side edge type back light.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An illuminating apparatus comprising:
   N light emitting diodes, where N is an integer equal to or larger than one;
   N sets of lead frames mounted with said N light emitting diodes, and one or more sets of lead frames each not mounted with a light emitting diode; and
   a transparent sealer for sealing said N lead frames mounted with said N light emitting diodes, and said one or more sets of lead frames each not mounted with a light emitting diode for integration into a module;
   wherein said N sets of lead frames mounted with said N light emitting diodes include at least two pieces of lead frames for each set of lead frames which enable electric current flow therethrough for the light emitting diode mounted thereon, and said one or more sets of lead frames each not mounted with a light emitting diode comprise at least two pieces of lead frames for each set of lead frames which do not enable current flow therethrough for a light emitting diode which is not mounted thereon.

2. An illuminating apparatus according to claim 1, wherein:
   said illuminating apparatus comprises four or more of said light emitting diodes (N≧4),
   (N−3) sets of said lead frames are not mounted with said light emitting diodes,
   each of said light emitting diodes mounted on an outermost set of lead frames is positioned in an upper half area above a center line of said outermost set of lead frames or a lower half area below the center line, and
   each of said light emitting diodes mounted on an inner set of lead frames is positioned on the center line of said inner set of lead frames.

3. An illuminating apparatus according to claim 1, wherein:
   two or more of said modules are connected through a series of lead frames.

4. An illuminating apparatus according to claim 1, wherein;
   said module comprises four light emitting diodes (N=4), and said light emitting diodes include a red light emitting diode, two green light emitting diodes, and a blue light emitting diode.

5. An illuminating apparatus comprising:
   N light emitting diodes, where N is an integer equal to or larger than two;
   N sets of lead frames mounted with said N light emitting diodes, and one set of lead frames not mounted with a light emitting diode provided for every two of said N sets of lead frames; and
   a transparent sealer for sealing said N sets of lead frames mounted with said N light emitting diodes, and said sets of lead frames each not mounted with a light emitting diode for integration into a module;
   wherein said N sets of lead frames mounted with said N light emitting diodes include at least two pieces of lead frames for each set of lead frames which enable electric current flow therethrough for the light emitting diode mounted thereon, and said one set of lead frames not mounted with a light emitting diode for every two of said N sets of lead frames comprise at least two pieces of lead frames for said one set of lead frames which do not enable current flow therethrough for a light emitting diode which is not mounted thereon.

6. An illuminating apparatus according to claim 5, wherein two or more of said modules are connected through a series of lead frames.

7. An illuminating apparatus according to claim 5, wherein said module comprises four light emitting diodes (N=4), and said light emitting diodes include a red light emitting diode, two green light emitting diodes, and a blue light emitting diode.

8. An illuminating apparatus according to claim 4, wherein each of said light emitting diodes for emitting red, green, and blue light has two electrodes disposed on the same surface, and is mounted on said set of lead frames with said electrodes being oriented downward.

9. An illuminating apparatus according to claim 8, wherein:
   each of said light emitting diodes for emitting green and blue light has two electrodes disposed on the same surface, and is mounted on said set of lead frames with said electrodes being oriented downward, and
   said light emitting diode for emitting red light has two electrodes, at least one of which is disposed on a top surface, said electrode on the top surface being bonded to said lead frame through a bonding wire.

10. An illuminating apparatus according to claim 8, wherein each of said light emitting diodes for emitting red, green, and blue light has two electrodes, at least one of which is disposed on a top surface, said electrode on the top surface being bonded to said lead frame through a bonding wire.

11. An illuminating apparatus according to claim 8, wherein:
   said light emitting diode having said electrodes on the same surface is mounted over two pieces of said set of lead frames with said electrodes being oriented downward, said two pieces of said set of lead frames being in a V-shape and an inverted V-shape, respectively, and having respective vertex angles equal to approximately 90 degrees and 270 degrees.

12. An illuminating apparatus according to claim 1 or 5, wherein:
   said lead frame is made of copper or an alloy mainly containing copper, and
   said lead frame is plated with silver or a metal material mainly containing silver on at least an area thereof on which said light emitting diode is mounted.

13. An illuminating apparatus according to claim 1 or 5, wherein said lead frame has a larger thickness in an area on which said light emitting diode is mounted than the remaining area of said lead frame.

14. An illuminating apparatus according to claim 1 or 5, wherein said transparent sealer for sealing said light emitting diodes and said lead frames includes a reflector plate.

15. An illuminating apparatus according to claim 1 or 5, wherein said lead frame is adhered to a board through an insulating layer.

16. A method for fabricating the illuminating apparatus according to claim 1 or 5, comprising:
- a light emitting diode mounting step of mounting said light emitting diodes on said lead frames;
- a light emitting diode sealing step of sealing said light emitting diodes mounted on said lead frame with said transparent sealer;
- a testing step between said light emitting diode mounting step and said light emitting diode sealing step for testing at least a light emitting state and a mounting state of said light emitting diodes; and
- a light emitting diode re-mounting step of newly mounting a light emitting diode at a location of said set of lead frames at which said light emitting diode is not mounted when a defect is determined in said testing step.

17. A display apparatus comprising:
- a non-light emitting display panel comprised of a plurality of pixels for controlling reflection and transmission of light on a pixel-by-pixel basis;
- a back light disposed on a back surface of said non-light emitting display panel and comprised of a plurality of the illuminating apparatuses according to claim 1 or 5; and
- optical members interposed between said non-light emitting display panel and said back light for controlling uniformity and directivity of light from said back light.

18. An illuminating apparatus according to claim 11, wherein said two pieces of said set of lead frames having said light emitting diode mounted thereover are spaced from one another so that said light emitting diode straddles the space therebetween.

* * * * *